US009089036B2

(12) United States Patent
Satoh et al.

(10) Patent No.: US 9,089,036 B2
(45) Date of Patent: Jul. 21, 2015

(54) LIGHT-EMITTING DEVICE AND MANUFACTURING METHOD

(71) Applicant: PANASONIC CORPORATION, Osaka (JP)

(72) Inventors: Takuya Satoh, Kyoto (JP); Kenichi Nendai, Kyoto (JP)

(73) Assignee: JOLED INC, Tokyo (JP)

( * ) Notice: Subject to any disclaimer, the term of this patent is extended or adjusted under 35 U.S.C. 154(b) by 62 days.

(21) Appl. No.: 13/671,594

(22) Filed: Nov. 8, 2012

(65) Prior Publication Data

US 2013/0062658 A1 Mar. 14, 2013

Related U.S. Application Data

(63) Continuation of application No. PCT/JP2011/005056, filed on Sep. 8, 2011.

(51) Int. Cl.
*H01L 33/00* (2010.01)
*H05B 33/10* (2006.01)
*H01L 27/32* (2006.01)
*H01L 51/52* (2006.01)

(52) U.S. Cl.
CPC ............ *H05B 33/10* (2013.01); *H01L 27/3225* (2013.01); *H01L 51/5215* (2013.01); *H01L 51/5253* (2013.01)

(58) Field of Classification Search
CPC . H01L 27/32; H01L 27/3202; H01L 27/3204; H01L 27/3209; H01L 27/3211; H01L 27/3225; H01L 27/3251; H01L 2924/12044
See application file for complete search history.

(56) References Cited

U.S. PATENT DOCUMENTS

| 5,443,922 | A | 8/1995 | Nishizaki et al. |
| 2005/0012454 | A1 | 1/2005 | Yamazaki et al. |
| 2006/0292394 | A1* | 12/2006 | Iwaki et al. .................... 428/690 |
| 2007/0166567 | A1* | 7/2007 | Hung et al. .................... 428/690 |
| 2007/0205718 | A1 | 9/2007 | Yamazaki et al. |
| 2009/0001879 | A1 | 1/2009 | Ikeda et al. |
| 2009/0286445 | A1 | 11/2009 | Yamazaki et al. |
| 2010/0252857 | A1 | 10/2010 | Nakatani et al. |
| 2010/0301026 | A1* | 12/2010 | Oishi et al. ............... 219/121.67 |
| 2011/0198623 | A1* | 8/2011 | Matsushima ................... 257/88 |

FOREIGN PATENT DOCUMENTS

| JP | 5-163488 | 6/1993 |
| JP | 2005-38833 | 2/2005 |
| JP | 2009-27154 | 2/2009 |
| JP | 2011-40167 | 2/2011 |
| WO | 2009/075075 | 6/2009 |
| WO | 2011/067895 | 6/2011 |

* cited by examiner

*Primary Examiner* — Su C Kim
(74) *Attorney, Agent, or Firm* — Greenblum & Bernstein, P.L.C.

(57) ABSTRACT

A light-emitting device comprises a substrate, a light-emitting layer, a wire formed on the substrate and supplying electric power to the light-emitting layer; a transition metal oxide layer formed on the substrate and over the wire; a bank formed on the transition metal oxide layer defining an opening over the wire; an interception layer formed on a portion of the transition metal oxide layer that is exposed through the opening and intercepting migrating fluorine; an organic layer formed on the interception layer and doped with an alkali metal; and an electrode formed on the organic layer, electrically connected to the wire via the organic layer, the interception layer, and the transition metal oxide layer, and providing the electric power supplied by the wire to the organic layer.

19 Claims, 11 Drawing Sheets

50

10a

10b

LIGHT-EMITTING DEVICE AND MANUFACTURING METHOD

CROSS REFERENCE TO RELATED APPLICATION

This is a continuation application of PCT Application No. PCT/JP2011/005056 filed Sep. 8, 2011, designating the United States of America, the disclosure of which, including the specification, drawings and claims, is incorporated herein by reference in its entirety.

TECHNICAL FIELD

The present disclosure relates to a light-emitting device having a light-emitting layer arranged between a pixel electrode formed for each pixel, and a common electrode formed for all pixels.

DESCRIPTION OF THE RELATED ART

Conventional technology allows for a top-emission EL display device in which ITO (indium tin oxide), IZO (indium zinc oxide), or the like are used as transparent conducive material in a common electrode. These materials are oxides, and thus have high resistance in comparison to other metals, such as aluminium, otherwise used for the pixel electrode. As such, a variation in brilliance is produced across the light-emitting layer as voltage through the common electrode decreases.

In order to reduce this variation in brilliance across the light-emitting layer, an EL display device having a common electrode having electricity supplied thereto by a wire (hereinafter, power supply wire) has been proposed. FIG. 11 is a cross-sectional diagram of an EL display device having such a power supply wire, specifically illustrating a top-emission EL display device as described by Patent Literature 1. The EL display device 1000 includes a substrate 1001, a first electrode 1002 serving as the pixel electrode, a power supply wire 1003, a hole injection layer 1004, a bank 1005, a light-emitting layer 1006, a electron transport layer 1007, and a second electrode 1008 serving as the common electrode.

The first electrode 1002 and the power supply wire 1003 are arranged on the substrate 1001, and are separated by some interval. The bank 1005 is formed between the first electrode 1002 and the power supply wire 1003. The bank 1005 is formed by first forming a layer of bank material over the entirety of the first electrode 1002 and the power supply wire 1003, placing a mask having an opening of predetermined dimensions over the layer, and irradiating, then washing away any excess bank material with developer fluid.

The hole injection layer 1004, the light-emitting layer 1006, the electron transport layer 1007, and the second electrode 1008 are formed in the stated order over the first electrode 1002. Given that the EL display device is a top-emission device, the second electrode 1008 is formed using a material such as ITO, as described above. ITO is less susceptible to electron insertion from the light-emitting layer 1006 than alkali metals, for example. As such, the electron transport layer 1007 is conventionally disposed between the second electrode 1008 and the light-emitting layer 1006. An organic material doped with an alkali metal is, for example, used for the electron transport layer 1007.

The second electrode 1008 is formed over the power supply wire 1003, with the electron transport layer 1007 being disposed between the power supply wire 1003 and the second electrode 1008. Thus, the power supply wire 1003 and the second electrode 1008 are electrically connected.

CITATION LIST

Patent Literature

Patent Literature 1
Japanese Patent Application Publication No. 2011-40167

SUMMARY

The power supply wire 1003 is provided in order to constrain the decrease in voltage occurring in the second electrode 1008. As such, low contact resistance between the power supply wire 1003 and the second electrode 1008 is beneficial.

However, the inventors have discovered a possibility that the contact resistance between the power supply wire 1003 and the second electrode 1008 increases due to the fluorine contained in dross left over from the bank material. Such an increase in contact resistance in turn causes a decrease in the power supplied to the second electrode, which is problematic in that the decrease in voltage is not sufficiently constrained.

One non-limiting and exemplary embodiment provides a light-emitting device that constrains the increase in contact resistance.

In one general aspect, the techniques disclosed here feature a light-emitting device, comprising: a substrate; a light-emitting layer; a wire formed on the substrate and supplying electric power to the light-emitting layer; a transition metal oxide layer formed above the substrate and over the wire; a bank formed on the transition metal oxide layer so as to define an opening over the wire; an interception layer formed on a portion of the transition metal oxide layer that is exposed through the opening, and intercepting migrating fluorine; an organic layer formed on the interception layer and doped with an alkali metal; and an electrode formed on the organic layer, electrically connected to the wire via the organic layer, the interception layer, and the transition metal oxide layer, and providing the electric power supplied by the wire to the light-emitting layer.

With the above structure, the light-emitting device has an interception layer formed over the transition metal oxide layer exposed through the opening, and has an organic layer formed over the interception layer. Accordingly, the interception layer separates the organic layer and the transition metal oxide layer, and covers any bank material dross remaining on the transition metal layer after bank material formation. Thus, the fluorine in the dross is preventing from migrating into the organic layer, and the fluoridation of the alkali metal with which the organic layer is doped is avoided.

The increase is contact resistance is thought to occur because of the fluoridation of the alkali metal with which the organic layer is doped, which causes the alkali metal to become inert. Thus, fluoridation of the alkali metal is avoided in the light-emitting device, and as such, the increase in the contact resistance between the wire and the common electrode is constrained.

These general and specific aspects may be implemented using a manufacturing method Additional benefits and advantages of the disclosed embodiments will be apparent from the specification and figures. The benefits and/or advantages may be individually provided by the various embodiments and features of the

BRIEF DESCRIPTION OF DRAWINGS

FIG. 9 is a partial cross-section schematically representing the configuration of an EL display panel 10a.

DETAILED DESCRIPTION

Embodiments

Figure 1:
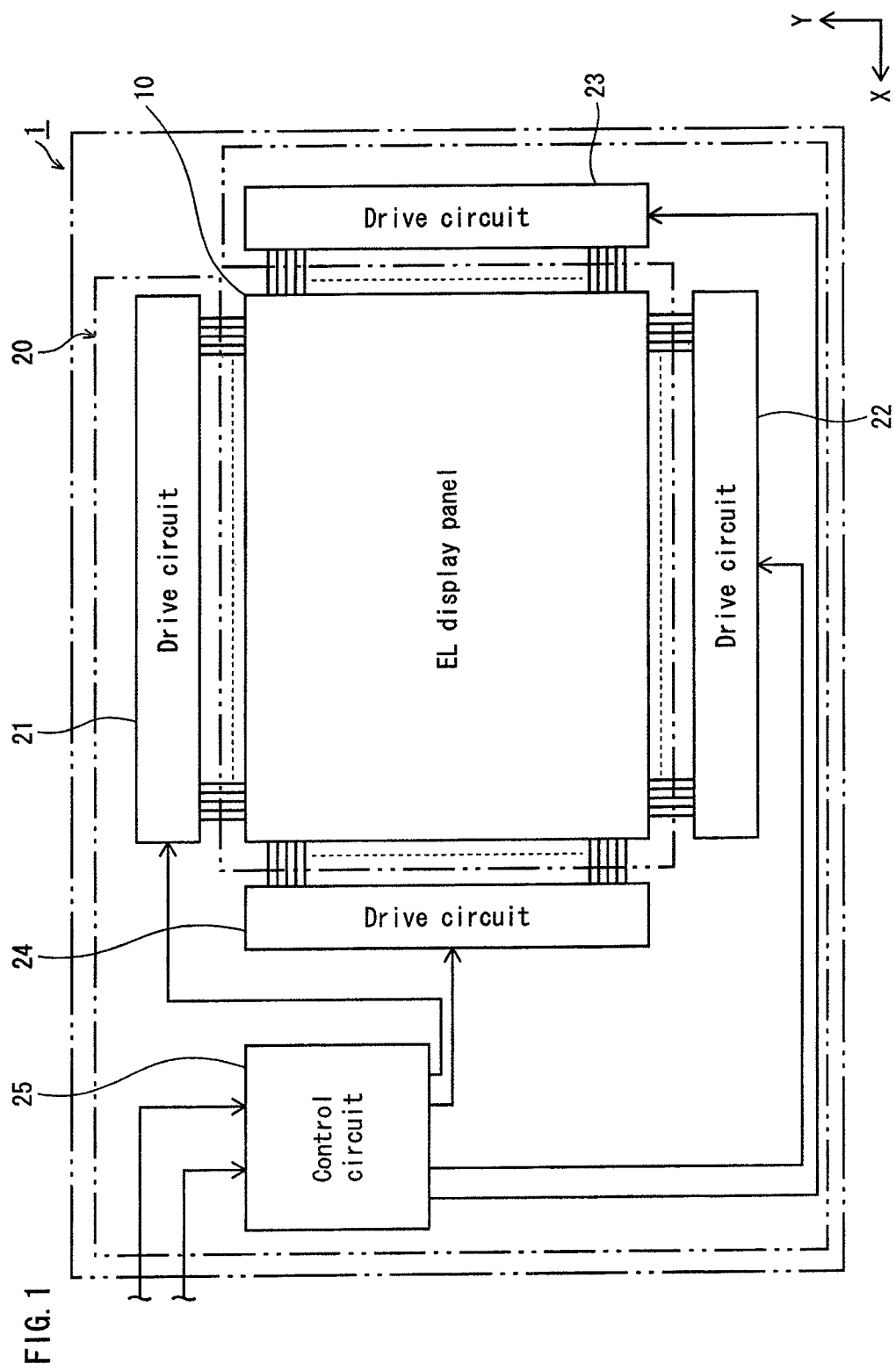
FIG. 1 is a block diagram schematically representing the overall configuration of a light-emitting device 1.

In one aspect, a light-emitting device comprises: a substrate; a light-emitting layer; a wire formed on the substrate and supplying electric power to the light-emitting layer; a transition metal oxide layer formed above the substrate and over the wire; a bank formed on the transition metal oxide layer so as to define an opening over the wire; an interception layer formed on a portion of the transition metal oxide layer that is exposed through the opening, and intercepting migrating fluorine; an organic layer formed on the interception layer and doped with an alkali metal; and an electrode formed on the organic layer, electrically connected to the wire via the organic layer, the interception layer, and the transition metal oxide layer, and providing the electric power supplied by the wire to the light-emitting layer.

With the above structure, the light-emitting device has an interception layer formed over the transition metal oxide layer exposed through the opening, and has an organic layer formed over the interception layer. Accordingly, the interception layer separates the organic layer and the transition metal oxide layer and covers any bank material dross remaining on the transition metal layer after bank material formation. Thus, the fluorine in the dross is preventing from migrating into the organic layer, and the fluoridation of the alkali metal with which the organic layer is doped is avoided.

The increase is contact resistance is thought to occur due to the fluoridation of the alkali metal with which the organic layer is doped, causing the alkali metal to become inert. Thus, the fluoridation of the alkali metal is avoidable in the light-emitting device, and as such, the increase in the contact resistance between the wire and the common electrode is constrained. Also, the organic layer has a base material that is an organic material having electron transport properties. Further, a pixel electrode is formed on the substrate so as to be coplanar with the wire while having an area of separation therebetween, and the pixel electrode is interposed between the substrate and the transition metal oxide layer. Further still, the transition metal oxide layer formed over the wire and the transition metal oxide layer formed over the pixel electrode are contiguous.

In another aspect, the interception layer is also formed on an inner wall of the opening in the bank.

The light-emitting device thus has an interception layer that intercepts not only the fluorine from bank material dross but also the (fluorine) outgassing from the bank. Accordingly, the alkali metal with which the organic layer is doped is better protected against fluoridation.

In a further aspect, the interception layer includes a material that is identical to the transition metal oxide layer. The interception layer has a thickness of 3 nm to 10 nm, inclusive.

In an additional aspect, the interception layer is formed from an alkali metal fluoride material. Here, the alkali metal fluoride material is sodium fluoride. The interception layer has a thickness of 2 nm to 5 nm, inclusive.

In yet another aspect, the interception layer includes one of Al, Ag, Mg, and Ta.

In still a further aspect, the transition metal layer includes one of Mo, W, Ti, In, Sn, Zn, and Ni.

In one aspect, a light-emitting device manufacturing method comprises: a first step of forming an insulation layer over a TFT substrate; a second step of forming a wire on the insulation layer, the wire supplying electric power to a light-emitting layer; a third step of forming a transition metal oxide layer over the insulation layer, the transition metal oxide layer covering the insulation layer; a fourth step of forming a bank on the transition metal oxide layer so as to define an opening that corresponds to the wire; a fifth step of forming an interception layer on a portion of the transition metal oxide layer that is exposed through the opening, the interception layer intercepting migrating fluorine; a sixth step of forming an organic layer doped with an alkali metal on the interception layer; and a seventh step of forming an electrode on the organic layer, the electrode providing the electric power supplied by the wire to the light-emitting layer.

Here, in the second step, a pixel electrode is formed on the insulation layer so as to be coplanar with the wire while having an area of separation therebetween, and in the fifth step, the interception layer is formed so as to extend over the pixel electrode.

Also, in the third step, the transition metal oxide layer is formed over the entirety of the wire and the pixel electrode.

In another aspect of the method, in the fifth step, the interception layer is also formed on an inner wall of the opening in the bank.

In a further aspect of the method, in the fifth step, the interception layer is formed using a material that is identical to the transition metal oxide layer.

Embodiment 1

Overall Configuration of Light-Emitting Device 1

FIG. 1 is a block diagram schematically representing the overall configuration of a light-emitting device 1. The light-emitting device 1 includes an electroluminescence display panel 10 (hereinafter, EL display panel) and a drive control unit 20 connected thereto. The EL display panel 10 is, for example, an top-emission organic electroluminescence panel employing the phenomenon of organic material electroluminescence. The drive control unit 20 is made up of four drive circuits 21-24 and a control circuit 25.

In practice, the arrangement of the drive control unit 20 relative to the EL display panel 10 within the light-emitting device 1 is not particularly limited.

—Configuration of EL Display Panel 10—

Figure 2:
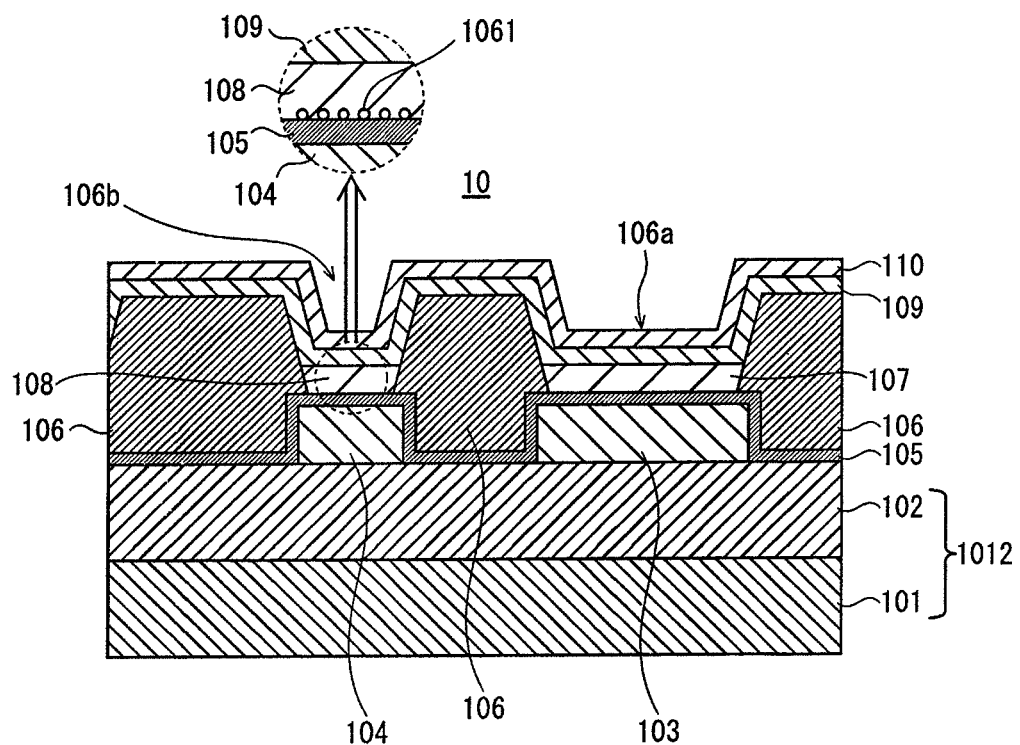
FIG. 2 is a partial cross-section schematically representing the configuration of an EL display panel 10.

FIG. 2 is a partial cross-section schematically representing the configuration of the EL display panel 10. FIG. 2 schematically illustrates a partial cut-away view of the EL display panel 10. The EL display panel 10 includes a TFT substrate 101, an inter-layer insulating membrane 102, a pixel electrode 103, a power supply wire 104, a hole injection layer 105, a bank 106, a light-emitting layer 107, an interception layer 108, an electron transport layer 109, and a common electrode 110. The detailed layer configuration of the EL display panel 10 is described below.

The inter-layer insulating membrane 102 is formed on the TFT substrate 101 (in the present description, a substrate 112 is defined as being the TFT substrate 101 with the inter-layer insulating membrane 102 formed thereon). The pixel electrode 103 and the power supply wire 104 are formed on the inter-layer insulating membrane 102 at positions on the inter-layer insulating membrane allowing a degree of mutual separation. The hole injection layer 105 is formed on the inter-layer insulating membrane 102 so as to also cover the pixel electrode 103 and the power supply wire 104.

The bank 106 is formed on the hole injection layer 105 so as to define a first opening that corresponds to the pixel electrode 103 and a second opening that corresponds to the power supply wire 104. The light-emitting layer 107 is formed on an area of the hole injection layer 105 that is exposed through the first opening (i.e., in an area above the pixel electrode 103). The electron transport layer 109 and the common electrode 110 are formed on the light-emitting layer 107, layered in the stated order.

Also, the electron transport layer 109 and the common electrode 110 are layered on an area of the hole injection layer 105 exposed through the second opening (i.e., in an area above the power supply wire 104), with the interception layer 108 being interposed between the hole injection layer 105 and the electron transport layer 109. Thus, as indicated in the magnified portion of FIG. 2, any dross 1061 remaining on the power supply wire 104 from the material forming the bank 106 is effectively covered by the interception layer 108. Also, the power supply wire 104 is electrically connected to the common electrode 110 via the interception layer 108 and the electron transport layer 109.

The electron transport layer 109 and the common electrode 110 cross over the bank 106, being formed over the combined entirety of the light-emitting layer 107 and the interception layer 108.

—Materials for EL Display Panel 10 Layers—

The following describes the materials used for the layers of the EL display panel 10.

—TFT Substrate 101—

The TFT substrate 101 is made up of a substrate having a TFT, a power supply wire material, a passivation layer, and so on formed thereon. The TFT may employ any of silicon, a semiconductor oxide such as indium-gallium-zinc oxide, and an organic semiconductor, such as pentacene, as the channel material. The substrate body is made of an insulating material, such as non-alkali glass, soda glass, non-fluorescent glass, phosphoric glass, boric gas, quartz, acrylic resin, styrene resin, polycarbonate resin, epoxy resin, polyethylene, polyester, silicone resin, aluminium oxide, and so on Also, the substrate body may optionally be an organic resin film.

—Inter-Layer Insulating Membrane 102—

The inter-layer insulating membrane 102 is made of an insulating material, such as polyimide resin or acrylic resin.

—Pixel Electrode 103—

No particular limitation is intended regarding the pixel electrode 103. However, using a reflective material is beneficial. The material may be a metal, a conductive oxide, or a conductive polymer, as appropriate. Possible metals include aluminium, a silver alloy, molybdenum, tungsten, titanium, chrome, nickel, zinc, or a zinc alloy. Possible conductive oxides include indium-tin oxide, indium-zinc oxide, and zinc oxide. Possible conductive polymers include polyaniline, polythiophene, and acidic or basic compounds thereof.

—Power Supply Wire 104—

The power supply wire 104 is beneficially made of the materials listed above for the pixel electrode 103.

—Hole Injection Layer 105—

The hole injection layer 105 injects holes into the light-emitting layer 107. The hole injection layer 105 is, for example, made of tungsten oxide ($WO_x$), molybdenum oxide ($MoO_x$), molybdenum-tungsten oxide ($Mo_xW_yO_z$), and other transition metal oxides. Among the transition metals, any of titanium, indium, tin, zinc, and nickel are useable.

—Bank 106—

The bank 106 is made of an organic material such as a resin, and is an insulator. The organic material may be, for example, acrylic resin, polyimide resin, or a novolac-type phenol resin. The bank 106 includes fluorine for increased repellency. The bank 106 is beneficially resistant to organic solvents. Further, given that the bank 106 is subjected to etching and baking processes, a material that is highly resistive to deformation and transformation under such processes is beneficial.

—Light-Emitting Layer 107—

When organic, the light-emitting layer 107 is preferably formed, for example, from a high molecular material such as polyfluorene, polyphenylene vinylene, polyacetylene, polyphenylene, polyparaphenylene ethylene, poly-3-hexylthiophene, or a derivative of any of these materials or, alternatively, from a fluorescent material recited in Japanese Patent Application Publication No. H5-163488, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodarnine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex, and so on.

—Interception Layer 108—

The interception layer 108 serves to block the migration of fluorine. The interception layer 108 is, for example, made to include one of the materials listed above for the hole injection layer 105. A metal that easily reacts with fluorine may also be included. Metals that easily react with fluorine include aluminium, silver, magnesium, and tantalum. The interception layer 108 may also be a fluorine compound. The fluorine compound may, for example, incorporate an element such as calcium, lithium, or sodium (hereinafter referred to collectively as alkali metal fluorides).

When the interception layer 108 includes the same material as the hole injection layer 105, the thickness thereof is beneficially 3 nm or greater. A thinner layer presents difficulties in pinhole production. Taking the contact resistance between the power supply wire 104 and the common electrode 109 into consideration suggests that a thickness of 10 nm or less is beneficial for the interception layer 108.

Also, when the interception layer 108 is made of an alkali metal fluoride material, the thickness thereof is beneficially no less than 2 nm and no greater than 5 nm. These dimensions are thinner than those given for the interception layer 108 when made to include the same material as the hole injection layer 105 because the presence of the alkali metal fluoride material enables better insulation than the hole injection layer 105 material.

—Electron Transport Layer 109—

The electron transport layer 109 is primarily made of an organic material having electron transport properties, and is doped with an alkali metal or an alkali earth metal. The organic material is beneficially one of the materials cited in Japanese Patent Application Publication No. H5-163488, such as a nitro-substituted fluorenone derivative, a thiopyran dioxide derivative, a diphenylquinone derivative, a perylene tetracarboxyl derivative, an anthraquinodimethane derivative, a fluorynylidene methane derivative, an anthrone derivative, an oxadiazole derivative, a perinone derivative, and a quinolone complex derivative.

—Common Electrode 110—

The common electrode 110 is beneficially made of a material that is highly transparent and highly conductive. Examples include indium-tin oxide and indium-zinc oxide.

The following describes the reasons why the EL display panel 10 configuration is able to constrain increases in contact resistance between the power supply wire 104 and the common electrode 110, by means of experiment.

—Experiment 1—

—Experimental Outline—

In order to evaluate the effect of bank material dross on the contact resistance between the power supply wire and the common electrode, a plurality of experimental devices (samples 1-6, 11-17, 21-27, and 31-37) were prepared, and the contact resistance was measured for each sample device.

—Experimental Devices—

The experimental devices each had the same basic configuration. The following describes the configuration of an experimental device 30 used as sample 1.

Figure 3:
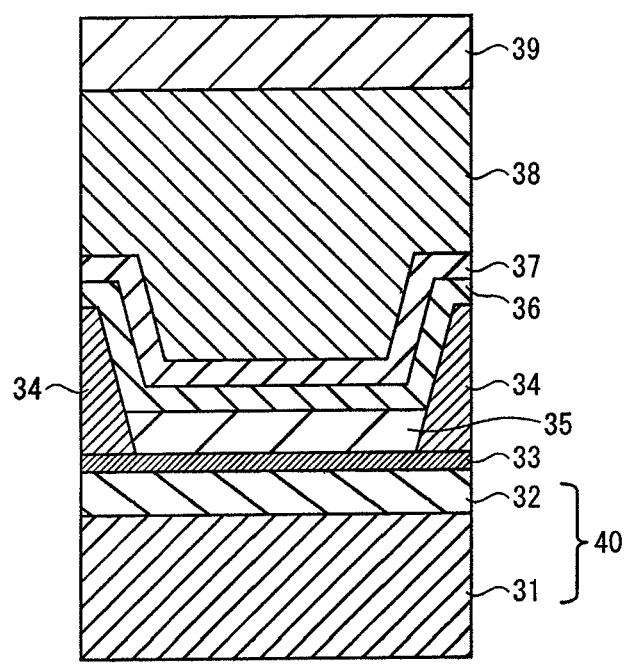
FIG. 3 is a cross-sectional diagram schematically representing the configuration of an experimental device 30.

FIG. 3 is a cross-sectional diagram schematically representing the configuration of the experimental device 30. As shown, the experimental device 30 includes a pixel electrode 40, a hole injection layer 33 formed over the pixel electrode 40, a bank 34 formed over the hole injection layer 33 and defining an opening, a light-emitting layer 35 formed within the opening, an electron transport layer 36 formed over the light-emitting layer 35, a common electrode 37 formed over the electron transport layer 36, a sealing layer 38 formed over the common electrode 37, and a casing 39 formed over the sealing layer 38. The pixel electrode 40 was formed using a laminate structure of ACL 31 and IZO 32, with the thickness of the ACL 31 being 200 nm and the thickness of the IZO 32 being 16 nm. $WO_x$ was used for the hole injection layer 33, the thickness thereof being 5 nm. The bank 34 was formed using acrylic resin, at a thickness of 1 μm. The bank 34 included fluorine for increased repellency. Once the bank 34 was formed, the opening therein was irradiated with UV rays for 90 s. The light-emitting layer 35 was formed using poly(p-phenylene vinylene) (hereinafter, PPV), at a thickness of 50 nm. The electron transport layer 36 was formed using organic ETL doped with barium, having a thickness of 35 nm. The barium made up 10% of the total mass. The common electrode 37 was formed using ITO at a thickness of 35 nm. The sealing layer 38 was formed using SiN at a thickness of 620 nm.

Samples 2-6 and 11-17 are configured identically to sample 1.

Samples 21-27 are also configured similarly to sample 1. However, in samples 21-27, the possibility that some bank material dross remained encrusted to the surface of the hole injection layer was taken into consideration. As such, the UV irradiation of the opening in the bank was extended to 300 s, and baking was performed in a vacuum in order to eliminate the encrusted dross. The vacuum backing process was performed at 200° C. for 60 minutes.

Likewise, samples 31-37 are also configured similarly to sample 1. However, in samples 31-37, the bank material was an inorganic material rather than resin. This was done in order to determine whether the presence of accreted dross is important, given the possibility of accretion. That is, the bank material was a material that does not produce organic dross. Specifically, SiN was used as the bank material.

—Experimental Results—

Figure 4:
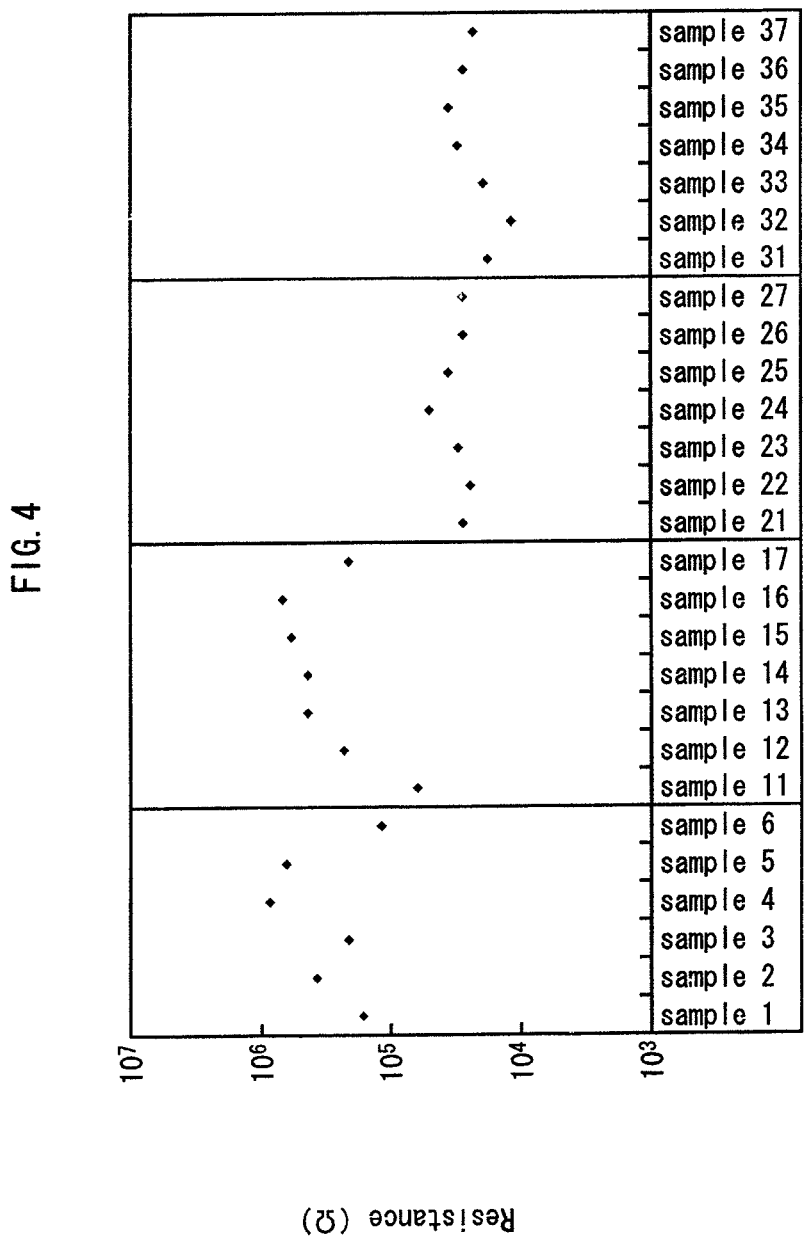
FIG. 4 is a graph representing the contact resistance in various samples.

FIG. 4 indicates the contact resistance for each of the samples. The vertical axis gives the resistance (in ohms).

As shown, samples 1-7 and 11-17 each have a resistance that falls within a range of $10^5 \Omega$ to $10^6 \Omega$, with the exception of sample 11.

Also, samples 21-27 each have a resistance that falls within a range of $10^4 \Omega$ to $10^5 \Omega$.

Similarly, samples 31-37 each have a resistance that falls within a range of $10^4 \Omega$ to $10^5 \Omega$.

Sample 11 has a resistance that is less than $10^5 \Omega$ but that is large in comparison to the resistance of samples 21-27 and 31-37.

To summarise, FIG. 4 indicates that the resistance of each of samples 21-27 and 31-37 is lower than the resistance of samples 1-7 and 11-17.

Given that samples 21-27 were subjected to vacuum baking, the organic dross originating from the bank is likely to have been eliminated therefrom.

As for samples 31-37, inorganic material was used for the bank, and thus, no organic dross was present.

Accordingly, these findings suggest that some accretion (i.e., organic dross) is present at the interface between the hole injection layer and the electron transport layer in samples 1-7 and 11-17, and that this accretion is the cause of contact resistance increases.

The following describes an experiment performed in order to determine the element present in the accretions.

—Experiment 2—

—Experimental Outline—

An experimental device was prepared and the constituent element of the accretion on the hole injection layer thereof was determined using SIMS.

—Experimental Devices—

Figure 5:
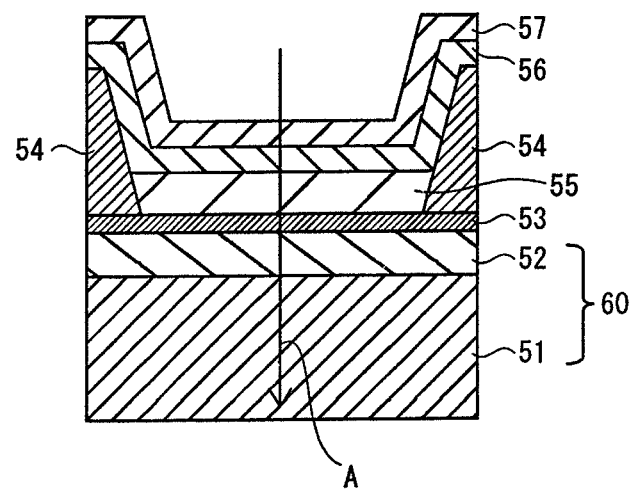
FIG. 5 is a cross-sectional diagram schematically representing the configuration of an experimental device 50.

FIG. 5 is a cross-sectional diagram schematically representing the configuration of the experimental device 50. As shown, the experimental device 50 includes a pixel electrode 60, a hole injection layer 53 formed over the pixel electrode 60, a bank 54 formed over the hole injection layer 53 and defining an opening, a light-emitting layer 56 formed within the opening, an electron transport layer 56 formed over the light-emitting layer 55, and a common electrode 57 formed over the electron transport layer 56. The pixel electrode 50 was formed using a laminate structure of ACL 51 and IZO 52, with the thickness of the ACL 51 being 200 nm and the thickness of the IZO 52 being 10 nm. $WO_x$ was used for the hole injection layer 53, the thickness thereof being 5 nm. The bank 54 was formed using acrylic resin, at a thickness of 1 µm. The bank 54 also included fluorine for increased repellency. The light-emitting layer 55 was formed using PPV, at a thickness of 50 nm. The electron transport layer 56 was formed using organic ETL doped with barium, having a thickness of 35 nm. The barium makes up 10% of the total mass. The common electrode 57 was formed using aluminium at a thickness of 35 nm.

SIMS was performed on the experimental device 50 as indicated by arrow A.

—Experimental Results—

Figure 6A:
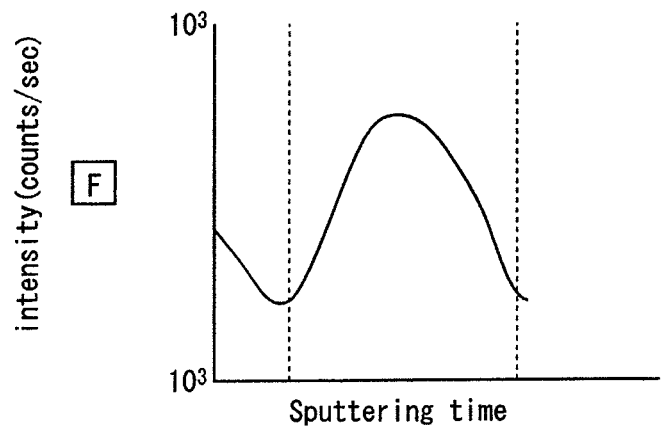
FIG. 6A is a graph of SIMS analysis results.
Figure 6B:
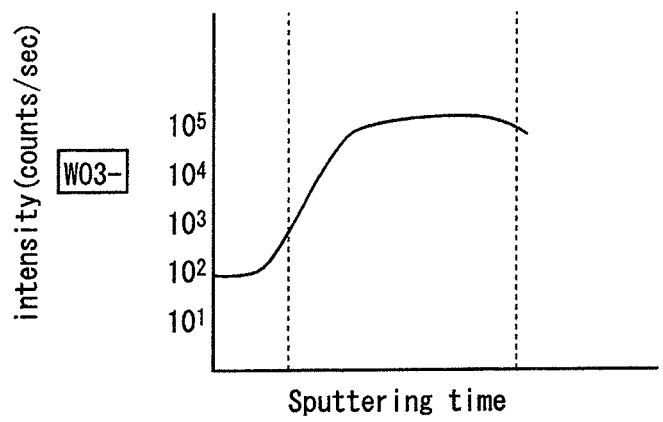
FIG. 6B is a another graph of SIMS analysis results.

FIG. 6A indicates the results of SIMS analysis by giving the fluorine component. FIG. 6B indicates the results of SIMS analysis by giving the tungsten oxide ($WO_3^-$) component. In FIGS. 6A and 6B, the vertical axis lists the intensity (in counts/sec) and the horizontal axis gives the sputtering time.

As shown in FIG. 6A, a peak in fluorine occurs for the experimental device 50. Fluorine is not expected to occur in the portion indicated by arrow A in FIG. 5 (i.e., in the pixel electrode 60, the hole injection layer 53, the light-emitting layer 55, the electron transport layer 56, and the common electrode 57).

Conversely, the bank 54 contains fluorine as a component added in order to impart repellence. Therefore, dross from the bank 54 appears to be left over after formation.

Also, the portion indicated by arrow A in FIG. 5 contains barium, an alkali metal that is prone to reacting with fluorine.

Thus, the increase in contact resistance found in Experiment 1 to occur in samples 1-7 and 11-17 is plausibly caused by the barium, with which the electron transport layer 36 has been doped, becoming fluoridated, or by the properties of the barium becoming inert.

Also, comparison of FIGS. 6A and 6B reveals that the peaks of tungsten oxide and of fluorine occur at approximately the same position. This indicates that the tungsten oxide acts to trap the fluorine.

In consideration of the above, forming a layer under the electron transport layer 36 so as to cover the organic material dross and trap the fluorine (e.g., a layer of tungsten oxide) is effective in order to avoid the fluoridation of the barium.

The EL display panel 10 has an interception layer 108 introduced between the hole injection layer 105 and the electron transport layer 109. The interception layer 108 is, for example, made of tungsten oxide and blocks the migration of fluorine to the electron transport layer 109. Accordingly, the increase in contact resistance caused by the fluorine is effectively suppressed.

—Manufacturing Method—

FIGS. 7A-7D and 8A-8C illustrate an example of a manufacturing method for the light-emitting device 1. FIGS. 7A-7D and 8A-8C each schematically indicate a partial cutaway view of the light-emitting device 1.

Figure 7A:
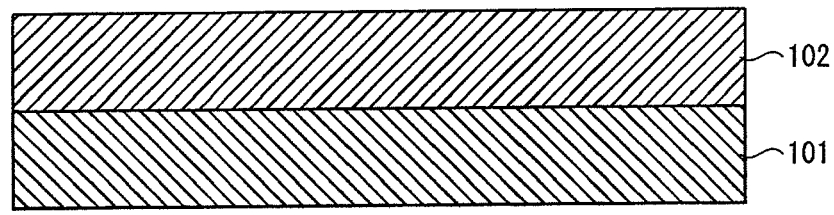
FIGS. 7A-7D illustrate an example of a manufacturing method for the EL display panel 10.

First, as shown in FIG. 7A, the inter-layer insulating membrane 102 is formed over the TFT substrate 101.

Figure 7B:
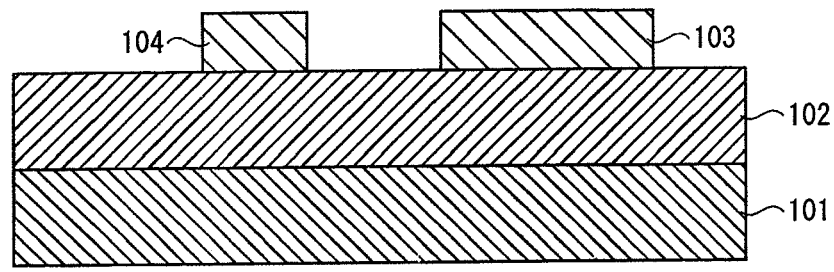
Figure 7C:
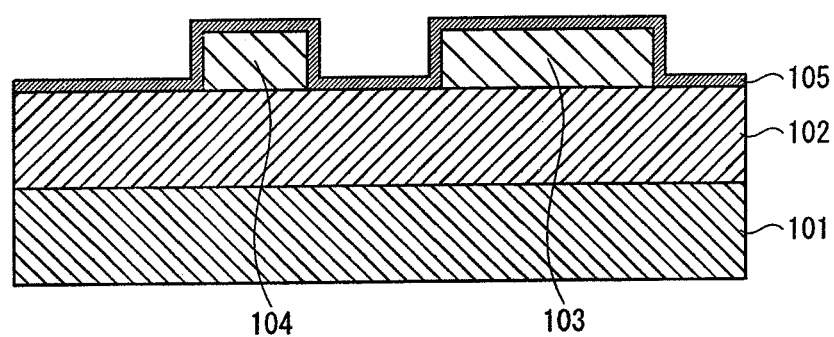

Next, a thin layer of conductive material is formed over the inter-layer insulating membrane 102. A vacuum thin-film coating method, such as vacuum deposition or sputtering, is useable for membrane formation. Once the membrane has been formed, the pixel electrode 103 and the power supply wire 104 are formed using photolithographic patterning, allowing a degree of separation therebetween as indicated in FIG. 7B. Forming the pixel electrode 103 and the power supply wire 104 from identical material simplifies the manufacturing process in that both elements are formed during the same step.

Once the pixel electrode 103 and the power supply wire 104 have been formed, the hole injection layer 105 is formed from, for example, $WO_x$, over the inter-layer insulating membrane 102 so as to cover the pixel electrode 103 and the power supply wire 104. A vacuum thin-film coating method, such as vacuum deposition or sputtering, is useable for forming the hole injection layer 105.

Figure 7D:
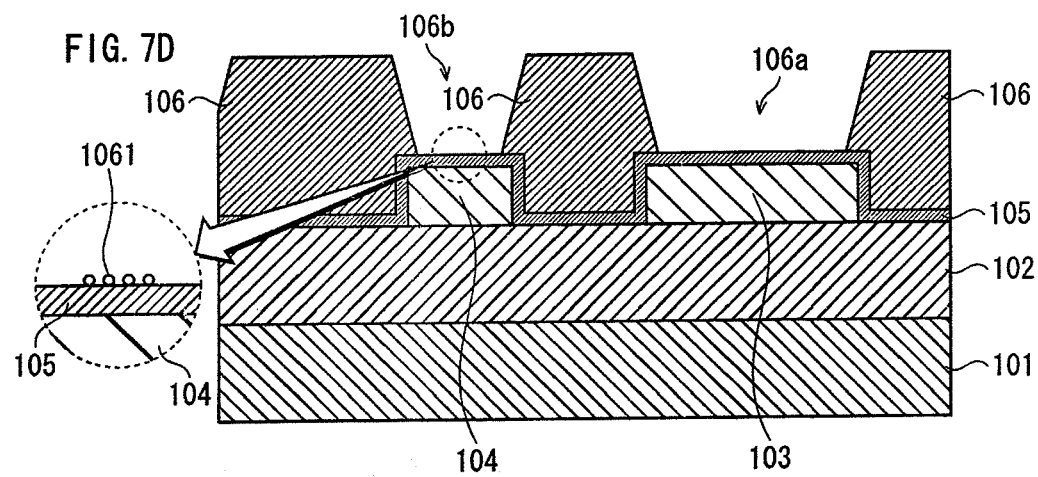

Next, a layer of bank material, which is an insulating material, is formed over the hole injection layer 105. The layer of bank material may be formed, for example, by coating. Afterward, a mask having an opening of predetermined dimensions is placed over the layer of bank material. The mask is then irradiated, and extraneous bank material is washed away with developer fluid. This completes the patterning of the bank material layer. Thus, the bank 106 is formed so as to define a first opening 106a and a second opening 106b is formed, as shown in FIG. 7D. However, some bank material dross 1061 remains in the area of the hole injection layer 105 exposed through the second opening 106b.

Figure 8A:
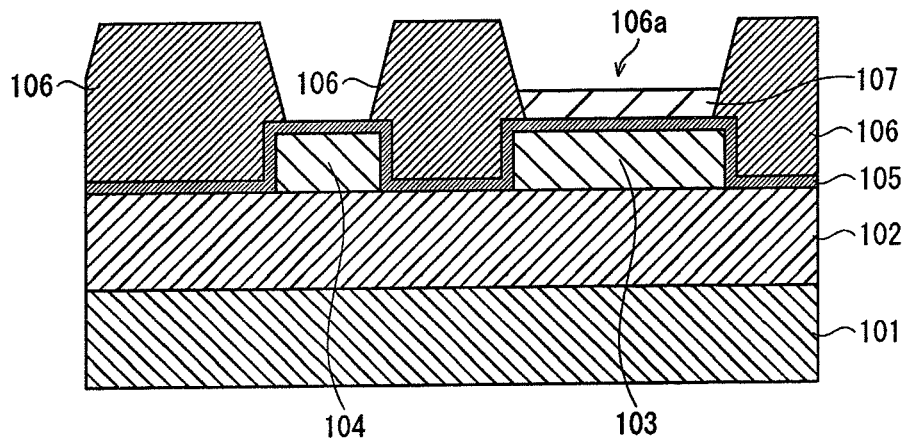
FIGS. 8A-8C illustrate further steps of the example of the manufacturing method for the EL display panel 10 that begins with FIG. 7A.

Next, the light-emitting layer 107 is formed in the area of the hole injection layer 105 exposed through the first opening 106a by dripping composition ink that includes light-emitting materials, using the inkjet method, for example (FIG. 8A).

Figure 8B:
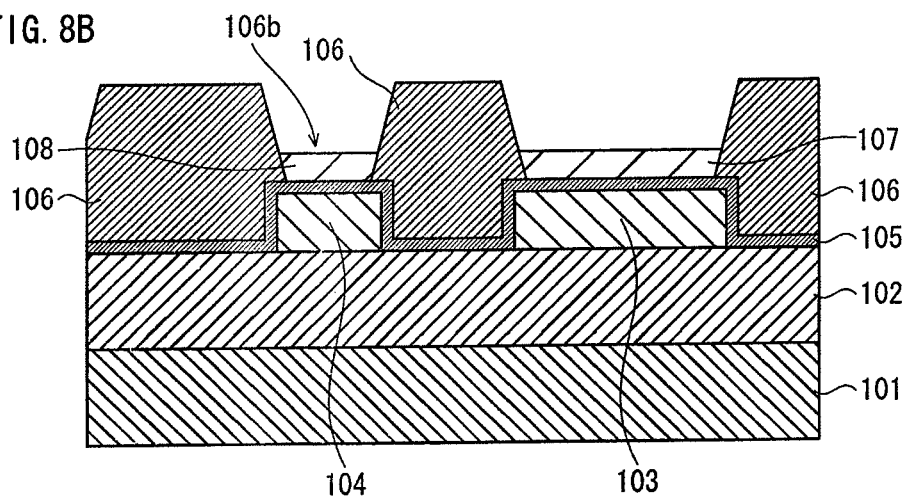
Figure 8C:
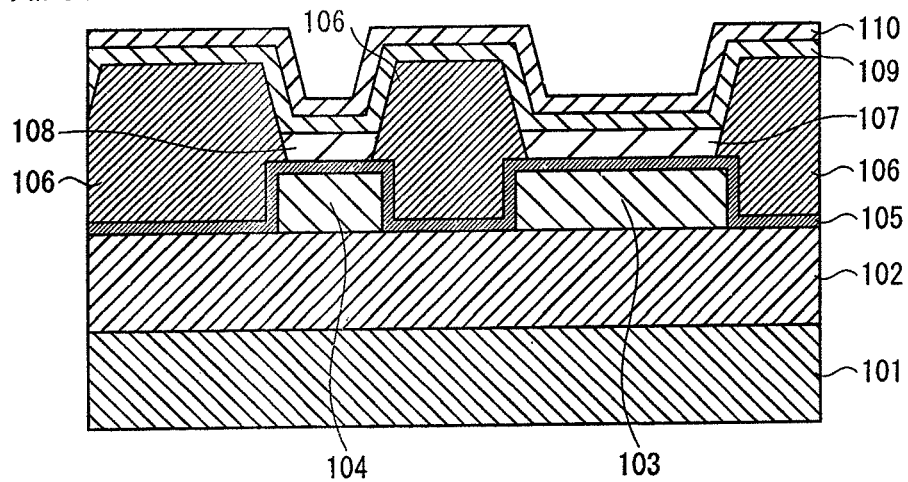

Once the light-emitting layer 107 has been formed, the interception layer 108 is formed in the area of the hole injection layer 105 exposed through the second opening 106b (FIG. 8B). A vacuum thin-film coating method, such as vacuum deposition or sputtering, is useable for forming the interception layer 108. The interception layer 108 may be formed of the same material as the hole injection layer 105. Doing so reduces the cost of forming the interception layer 108.

Next, the electron transport layer 109 and the common electrode 110 are formed over the entirety of the bank 106, the light-emitting layer 107, and the interception layer 108. A vacuum thin-film coating method, such as vacuum deposition or sputtering, is useable for forming the electron transport layer 109 and the common electrode 110.

—Effects—

The light-emitting device 1 has the interception layer 108 formed over the hole injection layer 105 in the area exposed through the second opening 106b of the bank 106, and as the electron transport layer 109 formed over the interception layer 108. Accordingly, the interception layer 108 serves to separate the electron transport layer 109 and the hole injection layer 105, and covers any dross bank material remaining on the hole injection layer 105. Thus, the transfer of fluorine from the dross to the electron transport layer 109 is blocked, and the fluoridation of the barium with which the electron transport layer 109 is doped is thereby avoided.

The increase in contact resistance is plausibly caused by the barium, with which the electron transport layer 109 has been doped, becoming fluoridated, or by the properties of the barium becoming inert. As described above, the fluoridation of the barium is avoidable in the light-emitting device 1. Thus, the increase in the contact resistance between the power supply wire 104 and the common electrode 110 is constrained.

Although the light-emitting device is described above with reference to the Embodiment, no particular limitation is intended. The following variations are also possible.

(Variation 1)

The following describes a variant pertaining to a different formation region for the interception layer.

Figure 9:
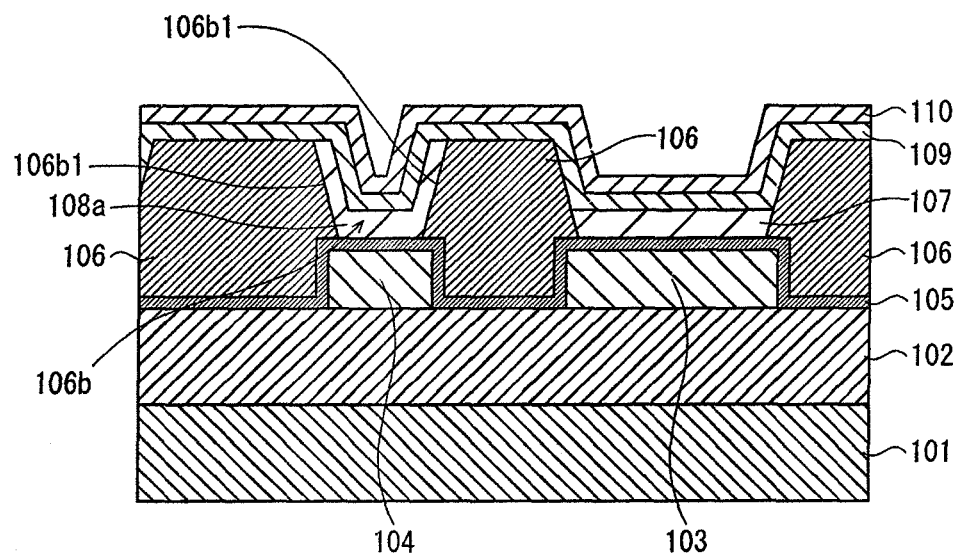

FIG. 9 is a partial cross-section schematically representing the configuration of an EL display panel 10a. EL display panel 10a is identical to EL display panel 10, with the exception of the interception layer 108a formation area. Accordingly, the explanation of the components of FIG. 9 identical to those of EL display panel 10 are omitted so as to focus on the points of difference.

In Variation 1, the interception layer 108a is formed in the area of the hole injection layer 105 exposed through the second opening 106b, and also on an inner wall 106b1 of the second opening 106b. Accordingly, the interception layer 108a intercepts not only the fluorine from bank material dross but also the (fluorine) outgassing from the bank 106. Thus, the alkali metal with which the electron transport layer 109 is doped is further prevented from fluoridation.

(Variation 2)

The following describes a variant pertaining to a different formation region for the interception layer.

Figure 10:
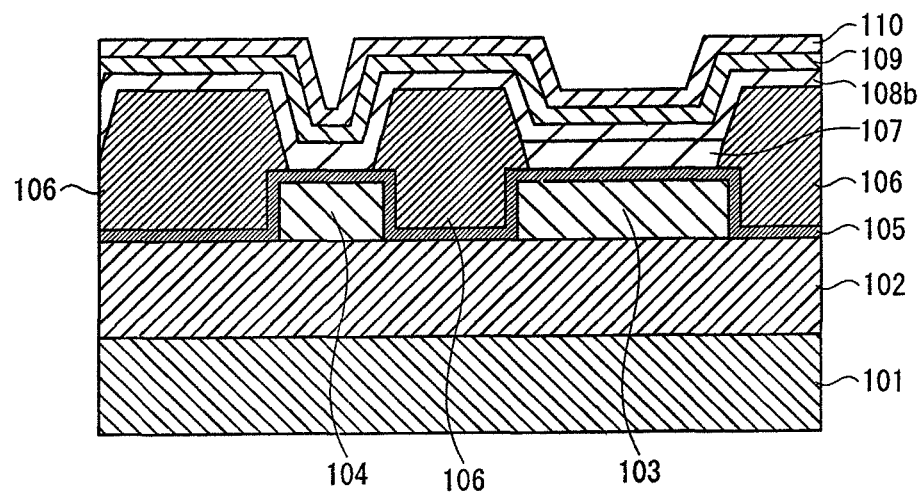
FIG. 10 is a partial cross-section schematically representing the configuration of an EL display panel 10b.
Figure 11:
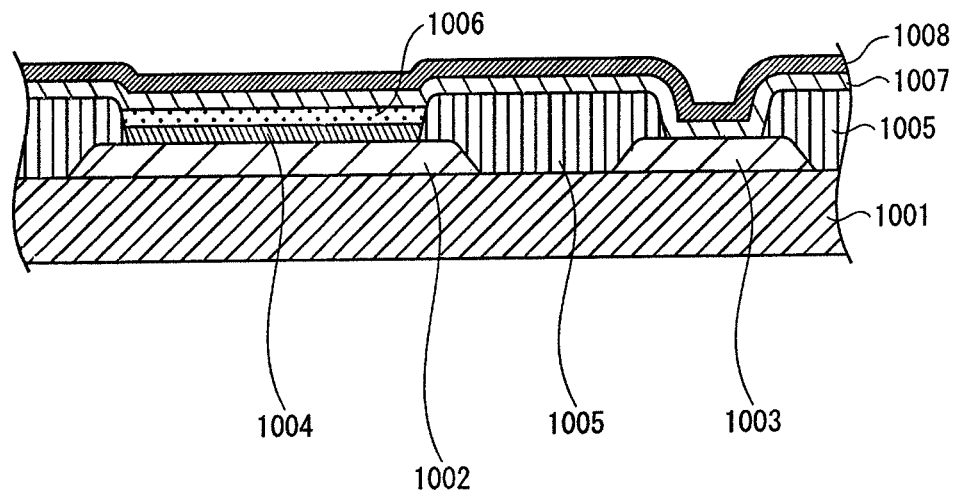
FIG. 11 is a partial cross-section schematically representing a display device 1000.

FIG. 10 is a partial cross-section schematically representing the configuration of an EL display panel 10b. EL display panel 10b is identical to EL display panel 10, with the exception of the interception layer 108b formation area. Accordingly, the explanation of the components of FIG. 10 identical to those of EL display panel 10 are omitted so as to focus on the points of difference.

In Variation 2, the interception layer 108b is formed over the entirety of the bank 106. Thus, the interception layer 108 does not require etching and so on. This is beneficial from a manufacturing perspective.

(Other Variations)

(1) Although the interception layer 108 is described as being formed after the light-emitting layer 107 has been formed, the interception layer 108 may instead be formed prior to forming the light-emitting layer 107.

(2) The following describes the fluorine interception mechanism in effect when the interception layer 108 is made from an alkali metal fluoride material (hereinafter, sodium fluoride). The mechanism operates in two possible ways.

The interception layer 108 contains sodium fluoride. However, the interception layer 108 is not entirely composed of sodium fluoride. Rather, the interception layer 108 also contains discrete atoms of fluorine and sodium. Accordingly, a first interception mechanism involves the sodium present in the interception layer 108 bonding with the fluorine in the dross, and thus being prevented from migrating into the electron transport layer 109. A second interception mechanism involves the fluorine present in the interception layer 108 repelling the fluorine in the dross, thus preventing migration into the electron transport layer 109.

INDUSTRIAL APPLICABILITY

The present disclosure is applicable to a light-emitting device featuring an EL display panel.

REFERENCE SIGNS LIST

1 Light-emitting device
10, 10a, 10b Electroluminescence display panel
20 Drive control unit
21-24 Drive circuits
25 Control circuit
101 TFT substrate
102 Inter-layer insulating membrane
103 Pixel electrode
104 Power supply wire
105 Hole injection layer
106 Bank
107 Light-emitting layer
108, 108a, 108b Interception layer
109 Electron transport layer
110 Common electrode

The invention claimed is:

1. A light-emitting device, comprising:
   a substrate;
   both a wire and a pixel electrode formed on the substrate, wherein the wire and pixel electrode are separated from each other in a plan view;
   a transition metal oxide layer formed on both the wire and the pixel electrode;
   a bank formed on the transition metal oxide layer so as to define a first opening above the pixel electrode and a second opening above the wire, a portion of the transition metal oxide layer being exposed at a bottom of the first opening, and a portion of the transition metal oxide layer being exposed at a bottom of the second opening;
   a light-emitting layer formed above the portion of the transition metal oxide layer that is exposed at the bottom of the first opening, and wherein the light-emitting layer is not formed above the portion of the transition metal oxide layer that is exposed at the bottom of the second opening;
   an interception layer formed on the portion of the transition metal oxide layer that is exposed at the bottom of the second opening, and intercepting migrating fluorine, and wherein the interception layer is not formed above the portion of the transition metal oxide layer that is exposed at the bottom of the first opening;
   an organic layer formed on the interception layer and the light-emitting layer, and doped with an alkali metal; and
   a common electrode formed on the organic layer so as to be seamless at least from an area above the interception layer to an area above the light-emitting layer,
   wherein the common electrode is electrically connected to the wire via the transition metal oxide layer, the interception layer, and the organic layer.

2. The light-emitting device of claim 1, wherein
the organic layer has a base material that is an organic material having electron transport properties.

3. The light-emitting device of claim 1, wherein
the pixel electrode is formed on the substrate so as to be coplanar with the wire, and
the pixel electrode is interposed between the substrate and the transition metal oxide layer.

4. The light-emitting device of claim 3, wherein
the transition metal oxide layer formed over the wire and the transition metal oxide layer formed over the pixel electrode are contiguous.

5. The light-emitting device of claim 1, wherein
the interception layer is also formed on an inner wall of the opening in the bank.

6. The light-emitting device of claim 1, wherein
the interception layer includes a material that is identical to the transition metal oxide layer.

7. The light-emitting device of claim 6, wherein
the interception layer has a thickness of at least 3 nm to at most 10 nm.

8. The light-emitting device of claim 1, wherein
the interception layer is formed from an alkali metal fluoride material.

9. The light-emitting device of claim 8, wherein the alkali metal fluoride material is sodium fluoride.

10. The light-emitting device of claim 8, wherein the interception layer has a thickness of at least 2 nm to at most 5 nm.

11. The light-emitting device of claim 1, wherein the interception layer includes one of Al, Ag, Mg, and Ta.

12. The light-emitting device of claim 1, wherein the transition metal layer includes one of Mo, W, Ti, In, Sn, Zn, and Ni.

13. A light-emitting device manufacturing method, comprising:
   forming an insulation layer over a TFT substrate;
   forming both a wire and a pixel electrode on the insulation layer so as to be separated from each other in a plan view;
   forming a transition metal oxide layer on both the wire and the pixel electrode;
   forming a bank on the transition metal oxide layer so as to define a first opening above the pixel electrode and a second opening above the wire, a portion of the transition metal oxide layer being exposed at a bottom of the first opening, and a portion of the transition metal oxide layer being exposed at a bottom of the second opening;
   forming a light-emitting layer above the portion of the transition metal oxide layer that is exposed at the bottom of the first opening, and wherein the light-emitting layer is not formed above the portion of the transition metal oxide layer that is exposed at the bottom of the second opening;
   forming an interception layer on the portion of the transition metal oxide layer that is exposed at the bottom of the second opening, the interception layer intercepting migrating fluorine, and wherein the light-emitting layer is not formed above the portion of the transition metal oxide layer that is exposed at the bottom of the second opening;
   forming an organic layer doped with an alkali metal on the interception layer and the light-emitting layer; and
   forming a common electrode on the organic layer so as to be seamless at least from an area above the interception layer to an area above the light-emitting layer,
   wherein the wire and the common electrode are electrically connected to each other via the transition metal oxide layer, the interception layer, and the organic layer.

14. The light-emitting device manufacturing method of claim 13, wherein
   in forming the wire and the pixel electrode, the pixel electrode is formed on the insulation layer so as to be coplanar with the wire, and
   in forming the interception layer, the interception layer is formed so as to extend over the pixel electrode.

15. The light-emitting device manufacturing method of claim 14, wherein
   in forming the transition metal oxide layer, the transition metal oxide layer is formed over the entirety of the wire and the pixel electrode.

16. The light-emitting device manufacturing method of claim 13, wherein
   in forming the interception layer, the interception layer is also formed on an inner wall of the opening in the bank.

17. The light-emitting device manufacturing method of claim 13, wherein
   in forming the interception layer, the interception layer is formed using a material that is identical to the transition metal oxide layer.

18. The light-emitting device of claim 1,
   wherein the first opening is formed with separation from the second opening, as seen in a plan view,
   wherein the interception layer is selectively formed within the second opening, and
   wherein the light-emitting layer is formed within the first opening.

19. The light-emitting device manufacturing method of claim 13,
   wherein the first opening is formed with separation from the second opening, as seen in a plan view,
   wherein the interception layer is selectively formed within the second opening, and
   wherein the light-emitting layer is formed within the first opening.

* * * * *